US006177666B1

(12) United States Patent
Akedo et al.

(10) Patent No.: US 6,177,666 B1
(45) Date of Patent: Jan. 23, 2001

(54) IMAGE FORMING APPARATUS HAVING A REMOVABLE ROUTE CHANGER

(75) Inventors: Shuichi Akedo; Kenji Oda; Shinji Yamamoto; Naoyuki Ishida; Susumu Hanano, all of Osaka (JP)

(73) Assignee: Kyocera Mita Corporation, Osaka (JP)

( * ) Notice: Under 35 U.S.C. 154(b), the term of this patent shall be extended for 0 days.

(21) Appl. No.: 09/233,630

(22) Filed: Jan. 19, 1999

(30) Foreign Application Priority Data

Jan. 19, 1998 (JP) ................................................ 10-007963

(51) Int. Cl.[7] .................................................... H01L 27/00

(52) U.S. Cl. .......................... 250/208.1; 250/239; 399/33

(58) Field of Search ................................ 250/208.1, 239, 250/234, 235, 236, 216; 355/408; 399/33, 31, 67, 71, 122, 123; 219/216

(56) References Cited

U.S. PATENT DOCUMENTS 5,206,682 * 4/1993 Yamada et al. ...................... 399/111

* cited by examiner

*Primary Examiner*—Que T. Le
(74) *Attorney, Agent, or Firm*—Jordan and Hamburg LLP

(57) ABSTRACT

In an image forming apparatus, after having a toner image fixed onto a sheet by fixing means, the sheet is selectively transported toward a certain destination of a plurality of destinations via one of a plurality of transport routes which is selected by a route changer mechanism. A frame is detachably mounted to a main body of the image forming apparatus. The fixing means and the route changer mechanism are mounted on the frame.

11 Claims, 3 Drawing Sheets

IMAGE FORMING APPARATUS HAVING A REMOVABLE ROUTE CHANGER

BACKGROUND OF THE INVENTION

This invention relates to image forming apparatuses such as copiers and printers provided with a plurality of sheet transport routes for transporting a sheet after an image fixation along a certain transport route of the plurality of transport routes and a route changer mechanism for selectively changing the transport route.

A construction of an image forming apparatus as shown in FIG. 3 is known in which a sheet after an image transfer is transported along a certain transport route of a plurality of transport routes and discharged outside a main body of the apparatus by an operation of a route changer mechanism.

FIG. 3 is a partially enlarged diagram of the construction. In FIG. 3, 302 is an imaging unit of the apparatus. The imaging unit 302 includes a photoreceptor 300 and a transfer roller 301. An image transfer is performed by the imaging unit 302.

Specifically, an electrostatic latent image is formed on an outer circumference of the photoreceptor 300 based on an image read from a document. By electrically attracting charged toner onto the latent image, the latent image is developed into a toner image on the surface of the photoreceptor 300. The toner image on the photoreceptor surface is electrically attracted to a copy sheet transported to the photoreceptor 300 due to a transfer voltage applied between the photoreceptor 300 and the transfer roller 301 to transfer the toner image onto the copy sheet. In this way, the toner image is transferred onto the sheet.

Fixing rollers 303, 303 are arranged downstream of the imaging unit 302 with respect to a sheet transport direction (indicated by the upward-directing arrow in FIG. 3). After passing the imaging unit 302, the sheet has the toner image fixed thereon by the fixing rollers 303, 303 by a thermal treatment. The fixing rollers 303, 303 are accommodated in a frame 303*a* composed of a resin or a metallic material together with a heater as a one-piece unit. The construction of the one-piece unit contributes to improvement of heat transmission efficiency.

A transport route formed downstream of the fixing rollers 303, 303 is branched into a transport route 305 communicating with a discharge port 307 and a transport route 304 communicating with a discharge port 308 opposite to the discharge port 307. A sheet after an image fixation is selectively transported either along the transport route 304 or the transport route 305 by the route changer mechanism.

Specifically, a switching member 306 as the route changer mechanism is provided at the junction of the transport routes 304, 305. The switching member 306 is pivotable about a pivot point to selectively guide a sheet after an image fixation to the transport route 304 and the transport route 305. When the switching member 306 is set in a state shown by the solid line in FIG. 3, the sheet is transported toward the transport route 305 while guided along the bold solid line P in FIG. 3 and discharged onto a discharge tray 313 via the discharge port 307. In this case, the sheet is discharged onto the discharge tray 313 with the side carrying an image facing downward.

On the other hand, when the switching member 306 is set in a state shown by the dashed line in FIG. 3, the sheet is transported toward the transport route 304 and discharged onto a finisher (not shown) or a discharge tray (not shown) with the side carrying an image facing upward.

Also, when the switching member 306 is set in the dashed-line state in FIG. 3 to guide a sheet along the transport route 304, the transport routes 304, 305 are communicated to each other. Accordingly, in this state, the transport routes 304, 305 functions as a switchback route to guide a sheet toward the discharge port 308 along the phantom line P' in FIG. 3 by performing the following operations.

Specifically, first, the switching member 306 is set in the solid-line state to temporarily transport a sheet toward the discharge port 307. When a tail end of the sheet reaches a certain position between a discharge roller pair 309, 309 provided near the discharge port 307 and the switching member 306, the discharge roller 309 is driven in a reverse direction. At this time, changing the posture of the switching member 306 to the dashed-line state allows the sheet to be transported toward the discharge port 304 along the transport routes 305, 304.

More specifically, in the above state when the switchback route is provided by the transport routes 304, 305, connecting the transport route 304 to an access route (not shown) via the discharge port 308 and the imaging unit 302 enables a double sided image transfer by feeding the sheet after a first image transfer again to the imaging unit 302 while utilizing the switchback route and the access route. The access route connecting the transport route 304 and the imaging unit 302 may be provided by mounting an external device on a side wall of the apparatus main body, e.g., a side wall of the apparatus on the same side as a cover 310 in which the discharge port 308 is formed.

The cover 310 is openably mounted on the side wall of the apparatus, and opening the cover 310 allows the transport route 304 accessible to outside of the apparatus. Likewise, a cover 311 is openably mounted on a top portion of the apparatus near the discharge port 307. Opening the cover 311 allows the transport route 305 to be accessible to outside of the apparatus. Opening the cover 310 (311) enables removing a jammed sheet in the transport route 304 (305).

In the above apparatus, in case of removing a jammed sheet in the transport route 304 (305), it is likely that the switching member 306 may be broken or damaged due to a pulling force exerted thereto. In such a case, it is required to replace the broken or damaged switching member 306 with a new one.

Since the route changer mechanism including the switching member 306 is directly mounted on the apparatus main body, a service person must take out the broken or damaged switching member 306 by inserting his/her hand inside the apparatus main body. As shown in FIG. 3, however, around the switching member 306 there are densely arranged a number of parts such as discharge rollers 312, 312 for feeding a sheet to the transport route 304 and the fixing rollers 303, 303 in a certain limited space, which makes a replacement cumbersome. In particular, it is highly likely that a new switching member 306 is mounted to the apparatus main body at a position deviated from the previous mounting position with respect to the fixing rollers 303, 303. Mounting at the deviated position obstructs securing the transport route for a sheet which has passed between the fixing rollers 303, 303 and is being transported toward the transport route 304 (305), thereby increasing the possibility of jamming.

There is an idea of providing a sufficient space in the apparatus for facilitating the replacement of the switching member 306 in order to improve serviceability of the apparatus. This idea, however, leads to production of a large sized apparatus and not favorable in a practical sense.

Accordingly, there is demanded an improved arrangement of the apparatus with improved serviceability of the route changer mechanism such as easy replacement of a switching member to eliminate a sheet transport failure due to a positional displacement of the route changer mechanism relative to the fixing rollers while effectively suppressing production of a large sized apparatus.

SUMMARY OF THE INVENTION

In view thereof, it is an object of the present invention to provide an image forming apparatus of a small size having an improved serviceability.

To fulfill the above object, an image forming apparatus, according to an aspect of this invention, comprises: a main body; a frame removably mounted on the main body; fixing means mounted on the frame for fixing a toner image onto a sheet transported in a predetermined direction; a plurality of transport routes for guiding the sheet after the fixation in a direction different from each other; and a route changer mounted on the frame downstream of the fixing means in the transport direction for selectively changing the transport route between the plurality of transport routes.

In this arrangement, the fixing unit and the route changer both are provided on the frame which is removably mounted on the apparatus main body. Accordingly, in case of facing a necessity of replacing the route changer due to damage or breakage of part thereof which may result from a removing operation of a jammed sheet and the like, merely removing the frame from the apparatus main body provides a large space for replacement of the route changer. Thereby, quick and easy replacement of the route changer is enabled.

Further, since the fixing unit and the route changer are both mounted on the frame, the positional relationship between the fixing unit and the route changer is stable. Accordingly, it is made possible to effectively prevent occurrence of jammed sheet that is a relatively common problem for the conventional apparatus due to a deviated positioning of the route changer relative to the fixing unit after the replacement.

Further, since there is no need of providing a large space for replacement in the apparatus main body, production of a large-sized apparatus is avoided.

These and other objects, features and advantages of the present invention will become more apparent upon reading of the following detailed description and accompanying drawings.

DETAILED DESCRIPTION OF THE INVENTION

Hereinafter, an embodiment of this invention is described with reference to the accompanying drawings.

Figure 1:
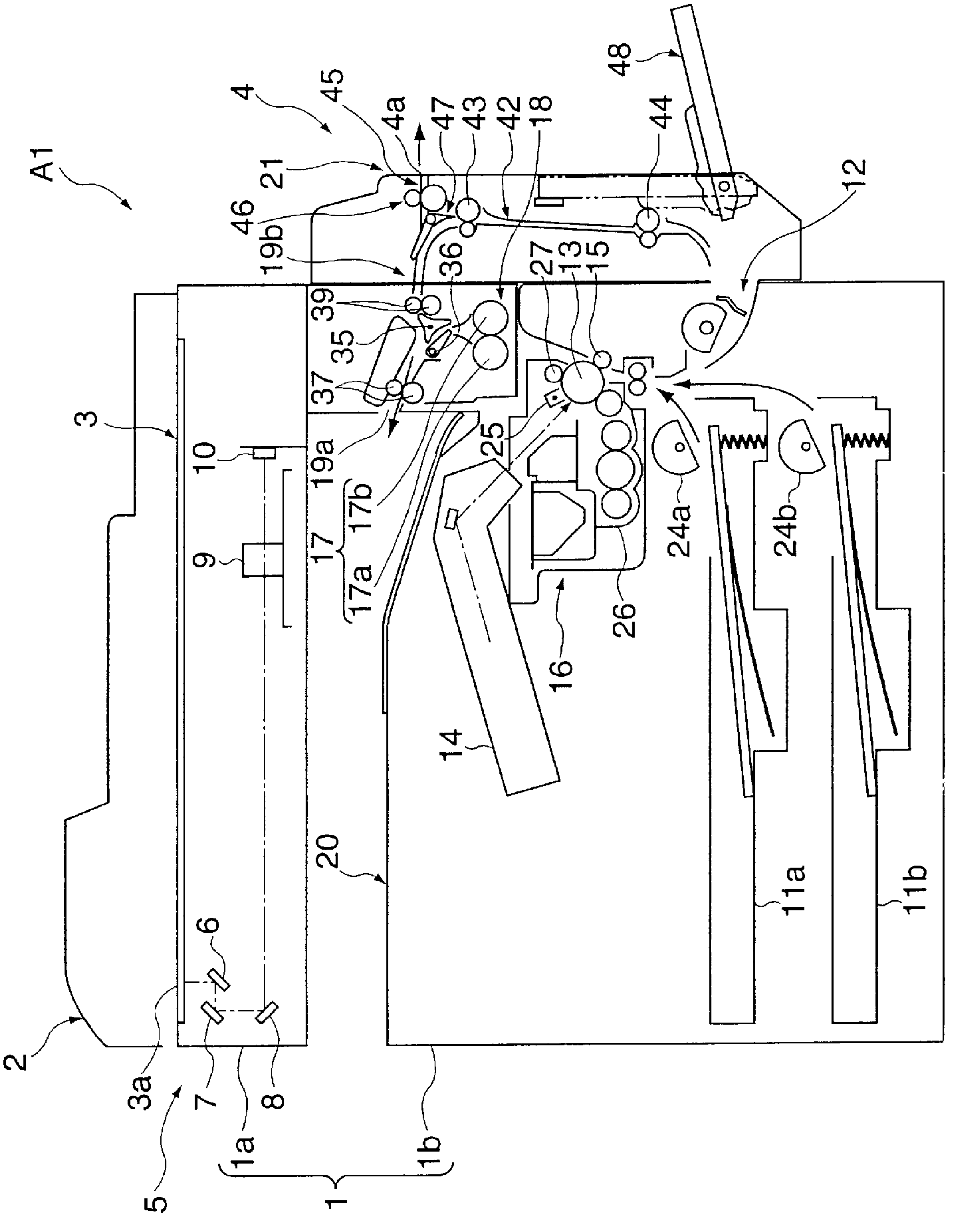
FIG. 1 is an overall schematic diagram of a copying machine as an embodiment of an image forming apparatus of this invention.

FIG. 1 is a schematic diagram showing an overall construction of a copying machine A1 as an embodiment of an image forming apparatus according to this invention. The copying machine A1 comprises a main body 1, an automatic reversible document feeder 2 (hereinafter, merely referred to as "Auto-Rev-Doc feeder 2") mounted on a top portion of the main body 1, and a doubled-sided copying transport unit 4 (hereinafter, referred to as "Dbl-Side-Copy transport unit 4") mounted on a side wall of the main body 1.

The machine main body 1 includes an image reading section 1*a* for reading an image of a document, and an image forming section 1*b* for forming an image read by the image reading section 1*a* on a copy sheet. The image reading section 1*a* is arranged above the image forming section 1*b* by an appropriate spacing. A sheet discharge portion 20 is provided in the spacing.

The Auto-Rev-Doc feeder 2 is provided at an upper portion of the image reading section 1*a*. The Auto-Rev-Doc feeder 2 is so constructed as to automatically transport a set of documents placed thereon successively onto an image reading area 3*a* of a document setting portion 3 provided on the image reading section 1*a* and discharge the set of documents successively thereon after an image reading.

The image reading section 1*a* includes an image reading optic system 5 for scanning an image on the document that is placed on the document setting portion 3 or fed to the image reading area 3*a* by the Auto-Rev-Doc feeder 2. The image reading optic system 5 receives light reflected from the document.

The image reading optic system 5 includes a fluorescent lamp (not shown), mirrors 6, 7, 8, a lens 9, and a line sensor 10. When the document surface is illuminated by the fluorescent lamp, the light reflected from the document surface is guided to the line sensor 10 via the mirrors 6, 7, 8 and through the lens 9. Each time the document is transported onto the image reading area 3*a,* the optic system 5 is activated to scan the document image.

In case of placing a document such as a bulky book and the like on the document setting portion 3 to copy an image of the document, the fluorescent lamp and the mirrors 6, 7, 8 are moved from left to right in FIG. 1 without activating the Auto-Rev-Doc feeder 2, thereby scanning the document image.

The image forming section 1*b* includes sheet cassettes 11*a,* 11*b* for accommodating copy sheets therein, a manual insertion inlet 12 through which a sheet is manually inserted from outside of the machine main body 1, a laser optic system 14 for irradiating laser beams of a level corresponding to a level inputted to the line sensor 10, an imaging assembly 16 for forming a toner image to transfer the toner image onto a copy sheet fed from the sheet cassette 11*a* (11*b*) or through the manual insertion inlet 12, a fixing unit 18 provided with a fixing roller pair 17, discharge ports 19*a,* 19*b* for discharging the sheet after an image fixation by the fixing unit 18, the sheet discharge portion 20 on which the sheet is stacked via the discharge port 19*a,* and transport means for transporting the sheet along a certain direction in accordance with a predetermined transport procedure.

The imaging assembly 16 includes a photoreceptor 13 for forming an electrostatic latent image on a surface thereof by a laser beam irradiated from the laser optic system 14. The imaging assembly 16 further includes a charger 25, a developer 26, a transfer roller 15, and a cleaning roller 27 in a periphery of the photoreceptor 13. The charger 25 charges the surface of the photoreceptor 13 at a predetermined potential. The developer 26 develops a latent image into a toner image. The transfer roller 15 transfers the toner image onto a copy sheet. The cleaning roller 27 removes toner residues on the surface of the photoreceptor 13.

The fixing unit 18 is detachably mounted to the machine main body 1. More specifically, drawing the fixing unit 18 forward of the machine main body 1 (forward direction on the plane of FIG. 1) detaches the fixing unit 18 from the machine main body 1.

Figure 2:
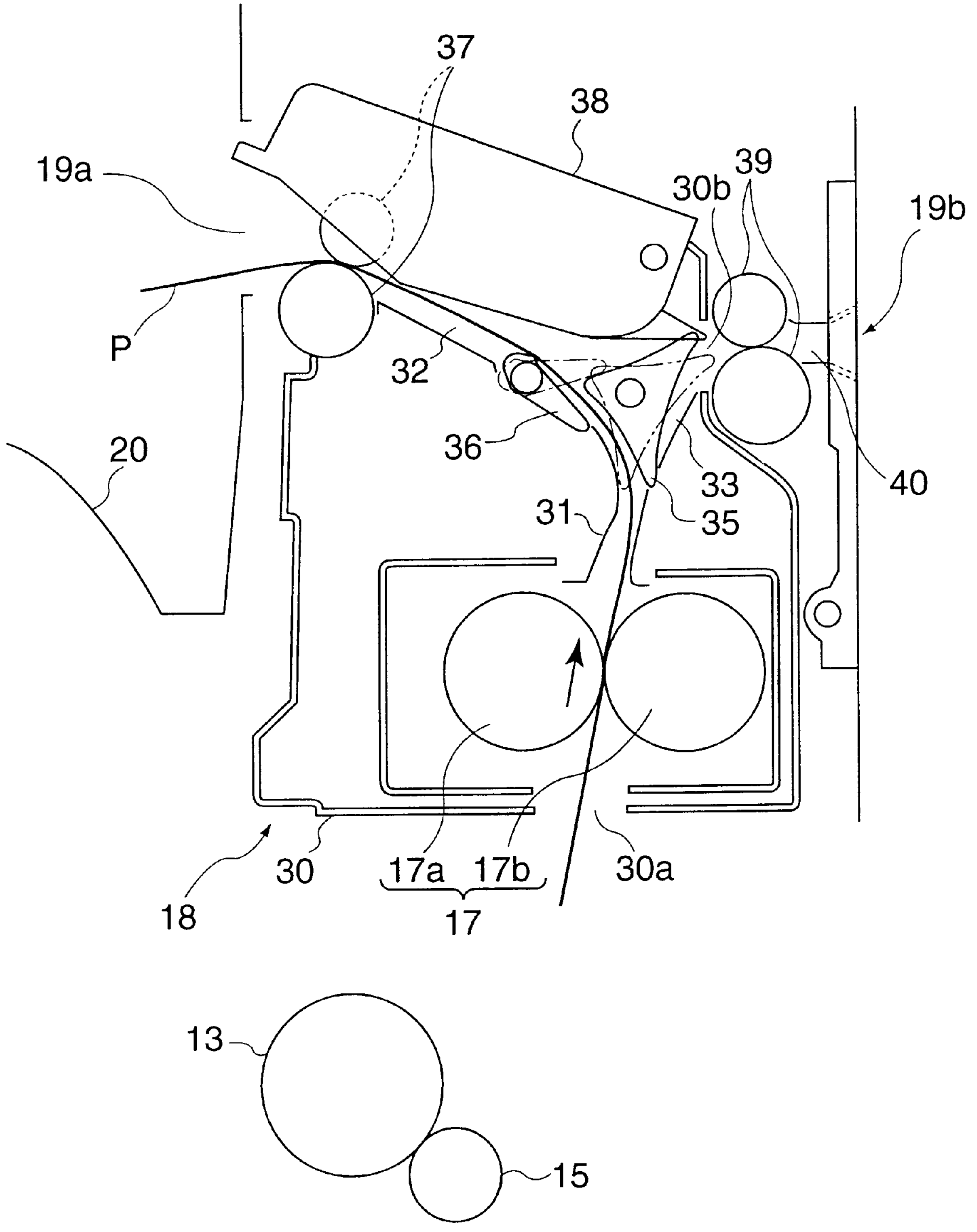
FIG. 2 is a partially enlarged view of a fixing unit, a switching member and its periphery in the copying machine.
Figure 3:
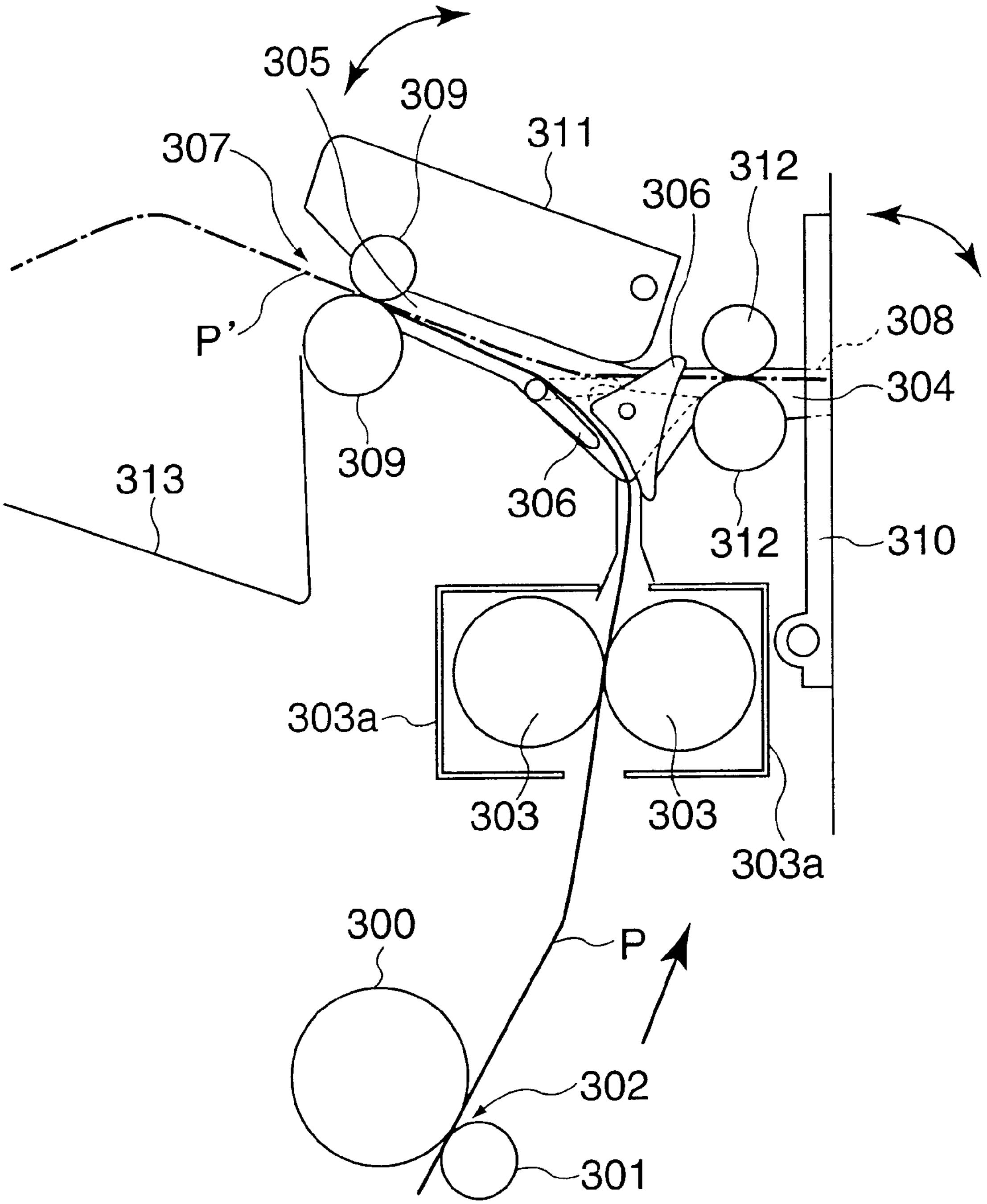
FIG. 3 (PRIOR ART)
FIG. 3 is a partially enlarged view of a fixing unit, a switching member and its periphery in an image forming apparatus of prior art.

The fixing unit 18 includes, a shown in FIG. 2, a box-shaped frame 30. The fixing roller pair 17 and a route changer mechanism for selectively changing the transport route for the sheet after passing the fixing roller pair 17 to discharge the sheet toward the discharge ports 19*a* (19*b*) are accommodated in the frame 30.

The fixing roller pair 17 consists of a heater roller 17*a* and a presser roller 17*b* which is pressed against the heater roller 17*a*. The fixing unit 18 is so constructed as to guide the sheet, after an image formation by the imaging assembly 16, between the heater roller 17*a* and the presser roller 17*b* through an inlet 30*a*. While passing between the heater roller 17*a* and the presser roller 17*b*, the sheet is heated with a heat of about 180° C. while pressed against the presser roller 17*b* to thereby fix the toner image which has been transferred onto the sheet by the imaging assembly 16.

A main route 31 for transporting a sheet after an image fixation is provided downstream of the fixing roller pair 17 with respect to a sheet transport direction shown by the upward-directing arrow in FIG. 2. The main route 31 is branched into a first route 32 (discharge route) for guiding the sheet toward the discharge port 19*a* and a second route 33 extending in a direction different from the extending direction of the first route 32 (upwardly rightward direction in FIG. 2) to guide the sheet to an outlet 30*b* formed in an upper portion of the frame 30. A discharge roller pair 37 is arranged on the first route 32 near the discharge port 19*a*. The route changer mechanism is provided at a junction of the main route 31 at which the first route 32 and the second route 40 constitute a bypass to a U-turn route 42 which is described later in detail.

The route changer mechanism includes switching members—namely a first and a second switching members 35, 36—which are pivotable about respective pivot points in association with each other to change the transport route for the sheet. The switching members 35, 36 are pivotable to change its posture between a first state (shown by the solid line in FIG. 2) to guide the sheet after the fixing roller pair 17 along the first route 32 and a second state (shown by the dashed line in FIG. 2) to guide the sheet along the second route 33.

More specifically, when the switching members 35, 36 are set in the first state, the sheet is guided along the first route 32 and discharged onto the discharge portion 20 through the discharge port 19*a* by the discharge roller pair 37 (namely, along the track shown by the solid line P in FIG. 2).

On the other hand, when the switching members 35, 26 are set in the second state, the sheet is transported along the second route 33, goes out of the fixing unit 18 through the outlet 30*b*, guided toward the discharge port 19*b* by a discharge roller pair 39 provided in the machine main body 1, and introduced into the Dbl-Side-Copy transport unit 4 along the guiding route 40 and through the discharge port 19*b*.

The first route 32 is so constructed as to be communicated with the outlet 30*b* of the frame 30 when the switching members 35, 36 are set in the second state. To render the first route 32 communicable with the outlet 30*b*, the switching members 35, 36 are set in the first state to temporarily transport the sheet in the direction toward the discharge port 19*a*, then reverses the rotation of the discharge roller 37 when a tail end of the sheet reaches a position between the discharge roller 37 and the switching member 36. Spontaneously with the reverse rotation of the discharge roller 37, the switching members 35, 36 are set in the second state. Thereby, the sheet is transported in the direction toward the outlet 30*b* opposite to the transport direction toward the discharge port 19*a*. In this way, changing the state of he switching members 35, 36 in association with the reverse rotation of the discharge roller 37 enables a switchback operation of the sheet.

A cover 38 is removably mounted on the frame 30 at an upper portion of the fixing unit 18. The cover 38 constitutes an upper wall of the first route 32 when mounted on the frame 30. The upper roller of the discharge roller pair 37 is rotatably supported on the cover 38.

The Dbl-Side-Copy transport unit 4 is detachably mounted on the machine main body 1. As shown in FIG. 1, the Dbl-Side-Copy transport unit 4 is internally provided with the U-turn route 42 (sheet circulating route) for guiding the sheet discharged outside of the machine main body 1 to the imaging assembly 16 again through the mutual insertion inlet 12, and a pair of transport rollers 43, 44 for transporting the sheet along the U-turn route 42. Guiding the sheet discharged out of the machine main body 1 again to the imaging assembly 16 enables a joint copying and a double-sided copying which are described later.

Referring to FIG. 1, a discharge route 45 extends at an upper portion of the Dbl-Side-Copy transport unit 4 from a junction of the U-turn route 42 at which the discharge route 45 intersects to a discharge port 4*a* formed in a side wall of the Dbl-Side-Copy transport unit 4. A discharge roller pair 46 is provided along the discharge route 45. A switching member 47 is provided at the junction of the discharge route 45 and the U-turn route 42, and is pivotable about a pivot point to change its posture between a state to enable guiding the sheet discharged out of the machine main body 1 through the discharge port 19*b* toward the manual insertion inlet 12 via the U-turn route 42 and a state to guide the sheet toward the discharge port 4*a* along the discharge route 45.

A manual insertion tray 48 is provided at lower part of the Dbl-Side-Copy transport unit 4. Stacking a set of sheets on the manual insertion tray 48 enables supplying the sheets from outside the machine main body 1 through the manual insertion inlet 12.

A sheet dispensed from the sheet cassette 11*a* (11*b*) is fed to the imaging assembly 16 by a feed roller 24*a* (24*b*) provided at a lead end (right side in FIG. 1) of the cassette 11*a* (11*b*).

Returning to an image forming operation in the imaging assembly 16, the surface of the photoreceptor 13 is uniformly charged by the charger 25, a laser beam is irradiated by the laser optic system 14 to expose a certain area of the surface of the photoreceptor 13, thereby forming an electrostatic latent image on the surface of the photoreceptor 13. While the latent image is developed into a toner image by the developer 26, the sheet dispensed from the sheet cassette 11*a* (11*b*) or fed through the manual insertion inlet 12 is transported between the photoreceptor 13 and the transfer roller 15 to transfer the toner image onto the sheet.

After passing the developer 26, the sheet is transported to the fixing unit 18. Then, after passing between the fixing roller pair 17, the sheet is transported either along the first route 32 or the second route 33 by a switching operation of the switching members 35, 36.

More specifically, when the switching members 35, 36 are set in the first state, the sheet is discharge onto the discharge portion 20 via the first route 32. At this time, the sheet is discharged on the discharge portion 20 with the side carrying the transferred image facing downward.

On the other hand, when the switching members 35, 36 are set in the second state, the sheet is discharged in the Dbl-Side-Copy transport unit 4 while flipped over along the second route 33 and the U-turn route 42. Accordingly, when the sheet is fed to the imaging assembly 16 again via the U-turn route 42 and the manual insertion inlet 12, the side carrying the transferred image opposes to the photoreceptor 13. Thereby, a joint copying is enabled in which an image is jointly transferred on a non-image area of the side of the sheet carrying an image.

In the case where the switching members 35, 36 are set in the second state and the sheet is discharged out of the Dbl-Side-Copy transport unit 4 along the discharge route 45 through the discharge port 4*a,* the sheet is discharged on a discharge tray (not shown) with the side carrying the transferred image facing upward.

In the case where the sheet is transported in the Dbl-Side-Copy transport unit 4 by a switchback operation along the first route 32 and the second route 33 and fed to the imaging assembly 16 again via the U-turn route 42 and the manual insertion inlet 12, the sheet is fed to the imaging assembly 16 this time in a state that the side carrying the transferred image opposes to the transfer roller 15. Thereby, when the sheet is transported to the imaging assembly 16 again, an image is transferred on the opposite side of the sheet. In this way, a double side copying is performed.

In the copying machine A1, there cannot be avoided a possibility that a sheet may be jammed in the first route 32, the second route 33 or while passing between the fixing roller pair 17. The switching members 35, 36 may be broken or damaged while removing the jammed sheet, thus leading to a necessity of replacing the switching members 35, 36.

In such a case, replacing the switching members 35, 36 is facilitated because the route changer mechanism including the switching members 35, 36 is incorporated in the fixing unit 18, and the fixing unit 18 is detachably mountable to the machine main body 1. Specifically, the fixing unit 18 is drawn out from the machine main body 1 by loosening several screws used for fixing the fixing unit 18 to the machine main body 1, and a wire connected to the machine main body 1 for power supply is disconnected. Then, opening the cover 38 of the fixing unit 18 exposes the switching members 35, 36 outside the machine main body 1 and provides a large space for replacing the switching members 35, 36.

In this way, unlike the conventional apparatus in which a service person has to insert his hand in a limited space inside the apparatus main body where a number of parts are densely arranged to replace the switching member(s), replacement of switching member(s) is facilitated. Providing the large space for replacement improves serviceability of the copying machine, since the service person can easily access to the switching member(s) for replacement from an appropriate direction. Thereby, replacement of the switching members 35, 36 is sped up.

Further, since the route changer mechanism including the switching members 35, 36, and the fixing roller pair 17 are both mounted in the fixing unit 18, the relative position of the switching members 35, 36 with respect to the fixing roller pair 17 can be easily maintained. As a result, there can be suppressed an occurrence of jamming of a sheet in or around the fixing unit 18 that has been a relatively common problem in the conventional apparatus due to a displaced positioning of the switching members relative to the fixing roller pair.

It is a common practice in the copying machine provided with a route changer mechanism and a plurality of transport routes to provide a fixing roller pair detachably mounted to a machine main body. Mounting the fixing roller pair 17 and the route changer mechanism such as the switching members 35, 36 in a frame and detechably mounting the frame on the machine main body 1, as described in the above embodiment, simplifies the mechanism for detachment, because there is required only one detachment mechanism. This construction is advantageous, in view of design and production cost, over a construction in which a fixing roller pair and a route changer mechanism are independently removable and mountable from/onto the machine main body. Because the relative position between these two elements are highly important, but independently mountable structure makes adjustment of the relative position therebetween more difficult.

To improve serviceability of the copying machine, there is an idea of providing a large space around the switching members 35, 36 in the machine main body 1. Providing the large space in the machine main body, however, leads to production of a large-sized copying machine, which is against an idea of downsizing. The construction of the copying machine A1 in which a space for replacement is secured by detachably mounting the fixing unit 18 to the machine main body 1 is effective in reducing the size of the machine main body 1.

In the above embodiment, replacement of the switching members 35, 36 has been primarily discussed. It is needless to say, however, maintenance service of the fixing roller pair 17 accommodated in the fixing unit 18 is also facilitated.

The copying machine A1 has been described as an embodiment of the present invention. An image forming apparatus such as a printer is also applied to the present invention.

In the above embodiment, the Dbl-Side-Copy transport unit 4 is used for a double side copying or a joint copying. Namely, a sheet after one side copying is transported to the imaging assembly via the Dbl-Side-Copy transport unit 4 without stacking. The present invention is applicable to an image forming apparatus such as a copying machine in which sheets after one side copying are temporarily stacked on an intermediate tray and then fed to the imaging assembly again from the intermediate tray one after another for a double side copying or a joint copying.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. An image forming apparatus comprising:

a main body;

a frame removably mounted on the main body;

a fixing unit mounted on the frame for fixing a toner image onto a sheet transported in a predetermined direction;

a plurality of transport routes for guiding the sheet after the fixation in a direction different from each other; and a route changer mounted on the frame downstream of the fixing unit in the transport direction for selectively changing the sheet transport route between the plurality of transport routes.

2. The image forming apparatus according to claim 1, wherein the route changer includes a switching member for selectively changing the sheet transport route between the plurality of transport routes.

3. The image forming apparatus according to claim 1 further comprising imaging unit provided in the main body for forming the toner image onto the sheet to transport the sheet after the image formation to the fixing unit, a sheet circulating route for guiding the sheet after the fixation to the imaging unit again, and discharge unit for stacking the sheet after the fixation thereon, wherein one of the plurality of transport routes is a discharge route for guiding the sheet after the fixation toward the discharge unit, and the other is a bypass for guiding the sheet after the fixation to the sheet circulating route.

4. The image forming apparatus according to claim 3, wherein the route changer is operative to connect the discharge unit and the sheet circulating route for allowing the sheet after the fixation to be transported from the discharge unit to the sheet circulating route.

5. The image forming apparatus according to claim 1, wherein the route changer includes a first switching member and a second switching member that are operatively working together for selectively changing the sheet transport route between the plurality of transport routes.

6. The image forming apparatus according to claim 1, wherein the frame has generally a U shape cross section and a cover is pivotably mounted on the frame on its top side to open and close the top opening of the frame.

7. The image forming apparatus according to claim 6, wherein the route changer is provided in the upper portion of the frame.

8. The image forming apparatus according to claim 6, wherein the route changer is provided in proximity of the top opening of the frame.

9. An image forming apparatus comprising:

a main body;

a plurality of transport routes for guiding a sheet after completion of an image fixation; and a frame unit removably mounted on the main body, the frame unit including therein:

a fixing member for fixing a toner image onto a sheet transported in a certain direction; and a route changer provided in a downstream side of the fixing unit for selectively changing the sheet transport route between the plurality of transport routes.

10. The image forming apparatus according to claim 9, a cover is pivotably mounted on the frame unit on its top side to open and close the top opening of the frame unit.

11. The image forming apparatus according to claim 10, wherein the route changer is provided in proximity of the top opening of the frame.

* * * * *